US012787237B2

(12) United States Patent
Straight et al.

(10) Patent No.: US 12,787,237 B2
(45) Date of Patent: Nov. 3, 2026

(54) BOND-DEGRADATION DEVICE FOR TESTING EMI/LIGHTNING SUSCEPTIBILITY AND EMISSION SUPPRESSION

(71) Applicant: Hamilton Sundstrand Corporation, Charlotte, NC (US)

(72) Inventors: Stephen Straight, Rocky Hill, CT (US); Robert C. Hoeckele, Granby, CT (US); Constantinos J. Mantis, Westfield, MA (US); Savannah Nadine Ibatuan, Hartford, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 171 days.

(21) Appl. No.: 18/658,029

(22) Filed: May 8, 2024

(65) Prior Publication Data

US 2025/0351316 A1 Nov. 13, 2025

(51) Int. Cl.

| | |
|---|---|
| ***H05K 9/00*** | (2006.01) |
| ***G01R 31/00*** | (2006.01) |
| ***H01R 13/6592*** | (2011.01) |

(52) U.S. Cl.
CPC ......... *H05K 9/0069* (2013.01); *G01R 31/002* (2013.01); *H01R 13/6592* (2013.01)

(58) Field of Classification Search
CPC .. H05K 9/0069; G01R 31/002; G01R 31/001; G01R 31/008; H01R 13/6592
See application file for complete search history.

(56) References Cited

U.S. PATENT DOCUMENTS

| | | | | |
|---|---|---|---|---|
| 4,218,745 | A | 8/1980 | Perkins | |
| 4,939,446 | A * | 7/1990 | Rogers ................. | G01R 31/001 338/214 |
| 6,225,810 | B1 | 5/2001 | Godo et al. | |
| 7,977,949 | B2 | 7/2011 | Williams | |
| 8,645,113 | B2 | 2/2014 | Sweers | |
| 9,459,300 | B2 | 10/2016 | Heiland et al. | |
| 10,264,688 | B2 | 4/2019 | Richardson et al. | |
| 11,002,766 | B2 | 5/2021 | Rawat et al. | |
| 2004/0048516 | A1* | 3/2004 | Mandrusov ........ | H01R 13/6592 439/607.41 |
| 2005/0046432 | A1* | 3/2005 | Tan ...................... | G01R 1/0416 324/750.27 |

(Continued)

FOREIGN PATENT DOCUMENTS

| | | | |
|---|---|---|---|
| CN | 103336192 | A | 10/2013 |
| CN | 116722487 | A | 9/2023 |
| EP | 2778695 | A1 | 9/2014 |

*Primary Examiner* — Akm Zakaria
(74) *Attorney, Agent, or Firm* — Kinney & Lange, P.A.

(57) ABSTRACT

Apparatus and associated methods relate to a bond-degradation device for testing EMI susceptibility and/or emission suppression of an electrical control system that includes a shielded cable assembly. The bond-degradation device includes a resistive annulus configured to be interposed between normally-connected first and second shielded connectors of the electrical control system. The resistive annulus introduces a resistance between shields of the normally-connected first and second shielded connectors, thereby compromising integrity of the shielding of conductive wires within the shielding of the shielded cable assembly by increasing loop resistance of the shielding.

20 Claims, 7 Drawing Sheets

Conducted Susceptibility Test Setup

(56) References Cited

U.S. PATENT DOCUMENTS

| | | | | |
|---|---|---|---|---|
| 2008/0084218 A1* | 4/2008 | Hailey | | G01R 31/002<br>324/627 |
| 2012/0285723 A1* | 11/2012 | Gundel | | H01B 7/0823<br>174/113 R |
| 2015/0129874 A1* | 5/2015 | Choi | | H01L 23/552<br>257/48 |
| 2015/0311643 A1* | 10/2015 | Gundel | | H01B 7/0823<br>174/102 R |
| 2021/0076546 A1* | 3/2021 | Valiente | | H05K 9/0081 |

* cited by examiner

Emission Suppression Test Setup

BOND-DEGRADATION DEVICE FOR TESTING EMI/LIGHTNING SUSCEPTIBILITY AND EMISSION SUPPRESSION

BACKGROUND

Electromagnetic interference (EMI) is the term used to describe when an electromagnetic signal that disturbs an electrical circuit and is generated by an external source. EMI can degrade the performance of the electrical circuit or even cause it to stop functioning altogether. Such disturbances can be caused by radiative coupling and/or by conductive coupling of the disturbing electromagnetic signal to the electrical circuit. Sources that can generate such electromagnetic signals include any natural or man-made generators of electromagnetic signals, such as, for example: lightning, solar flares, auroras, radio towers, ignition systems, mobile phones, etc. Local generators of low-energy electromagnetic signals can be sources of EMI, as well as distant generators of high-energy electromagnetic signals.

Electric circuits can be protected against performance degradation and circuit malfunction using shielding. Shielding is the term used to describe enclosing the electric circuit within a grounded conductive enclosure, such as, for example, a metal box or Faraday cage. By doing so, electromagnetic signals generated external to such enclosures will be reflected and attenuated by the grounded conductive enclosure. Such grounded conductive enclosures will thereby block these external electromagnetic signals from coupling to the electric circuitry within. Not only does shielding provide such protections against performance degradation and circuit malfunctioning caused by EMI, but shielding also contains emissions of the circuitry enclosed therein. By containing such emissions, shielding provides protection for other circuits that reside outside such shielding by reducing emissions of the circuitry that is enclosed within the shielding.

Many electrical circuits electrically communicate with electrical components, such as sensors and/or actuators, that are remotely located from such electrical circuits and their grounded conductive enclosures. Typically, such electrical circuits communicate with remotely located electrical sensors and/or actuators via insulated conductive wiring, which can include one or more insulated conductive wires. To maintain EMI protection for shielded electrical circuits that communicate with remotely located electrical sensors and/or actuators, the insulated conductive wiring used for such communication can also be shielded. Shielding of the insulated conductive wiring can be performed by wrapping the one or more insulated conductive wires within a conductive sheath, thereby surrounding the insulated conductive wiring with the conductive sheath. The shield of the conductive wiring (i.e., the conductive sheath surrounding the insulated conductive wiring) is typically grounded by conductively coupling the shield of the insulated conductive wiring with the grounded conductive enclosure of the electric circuit. Such grounding of the shield of the insulated conductive wiring can be accomplished using shielded connectors.

A shielded connector has a backshell which is a conductive member that surrounds one or more electrical contacts of the shielded connector. The electrical contacts of the shielded connector are conductively coupled with the conductive wires of the insulated conductive wiring, and the backshell of the shielded connector is conductively coupled with the shield of the insulated conductive wiring. The electrical circuitry within the grounded conductive enclosure conductively couples with the insulated conductive wiring via contacts of a complementary mating connector, which is complementary to the shielded connector coupled to the insulated conductive wiring. Typically, the complementary mating connector is attached to the grounded shielded enclosure, with the backshell of the complementary mating connector in conductive contact with the grounded shielded enclosure of the electric system. Thus, when the shielded connector attached to the insulated conductive wiring is connected with the complementary mating connector attached to the grounded shielded enclosure, connections are made both between the conductive wiring and the electric circuit and between the shield of the insulated conductive wiring and the grounded shielded enclosure. Shielded cable assembly is the term that describes such wring assemblies that include such shielded wiring and shielded connectors.

SUMMARY

Apparatus and associated methods relate to a bond-degradation device for testing EMI susceptibility and/or emission suppression of an electrical control system that includes a shielded cable assembly. The bond-degradation device includes a resistive annulus configured to be interposed between normally-connected first and second shielded connectors of the electrical control system. The resistive annulus introduces a resistance between shields of the normally-connected first and second shielded connectors thereby compromising integrity of the shielding of conductive wires within the shielding of the shielded cable assembly by increasing loop resistance of the shielding. The bond-degradation testing device includes a first complementary mating connector having a plurality of contacts surrounded by a conductive backshell configured to connect to a plurality of contacts and a conductive backshell-connecting member of the second shielded connector of the electrical control system. The bond-degradation testing device includes a second complementary mating connector having a plurality of contacts surrounded by a conductive backshell-connecting member configured to connect to a plurality of contacts and a conductive backshell of the first shielded connector of the electrical control system. The bond-degradation testing device includes a plurality of conductive wires that extend between and connect corresponding ones of the pluralities of contacts of the first and second complementary mating connectors. The bond-degradation testing device also includes a conductive shield that surrounds the plurality of wires and conductively couple to backshell of the first complementary mating connector and the backshell-connecting member of the second complementary mating connector.

Some embodiments relate to a method for testing EMI susceptibility of an electrical control system that includes a shielded cable assembly. The method includes disconnecting normally-connected first and second shielded connectors of the electrical control system. The method includes connecting a first complementary mating connector of a bond-degradation testing device to the second shielded connector of the electrical control system, thereby connecting a plurality of contacts surrounded by a conductive backshell of the first complementary mating connector of the bond-degradation testing device with a plurality of contacts and a conductive backshell-connecting member, respectively, of the second shielded connector of the electrical control system. The method includes connecting a second complementary mating connector of a bond-degradation testing device to the first shielded connector of the electrical control system, thereby connecting a plurality of contacts surrounded by a conductive backshell-connecting member of the second complementary mating connector of the bond-degradation testing device with a plurality of contacts and a conductive backshell, respectively, of the first shielded connector of the electrical control system. The bond-degradation testing device includes a plurality of conductive wires that extend between and connect corresponding ones of the pluralities of contacts of the first and second complementary mating connectors. The bond-degradation testing device includes a conductive shield that surrounds the plurality of wires and conductively couple to backshell of the first complementary mating connector and the backshell-connecting member of the second complementary mating connector. The bond-degradation testing device also includes a resistive annulus interposed between the backshell of the first complementary mating connector and the backshell-connecting member of the second complementary mating connectors, thereby compromising integrity of the shielding of conductive wires within the shielding of the shielded cable assembly by increasing loop resistance of the shielding. The method also includes testing EMI susceptibility or emission suppression of the electrical control system.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Many electrical circuits are used on aircraft, some of which are used for functions and operations of the aircraft. For example, engine control systems and flight control systems include electrical circuits, which can be disturbed by EMI. Some such electrical control systems are shielded so as to safeguard the functions and operations performed thereby mitigating performance degradation caused by EMI. Many of these electrical control systems are designed to be tolerant of a specified level of EMI. To ensure that these electrical control systems meet these design tolerances, the electrical control systems are tested while being subjected to various levels of EMI. Such testing does not, however, determine EMI/lightning susceptibility and emission suppression of such electrical control systems throughout the life of the electrical control systems. Over time, these electrical control systems experience degraded bonds (e.g., within or between shielding connections and/or grounded conductive enclosures, etc.), which can result from long-term exposure with the environment, in which these bonds reside. As such, it would be helpful to have a way to easily test the EMI susceptibility of electrical control systems using various resistances of the bonds in these systems (i.e., various bond-degradation conditions).

Figure 1:
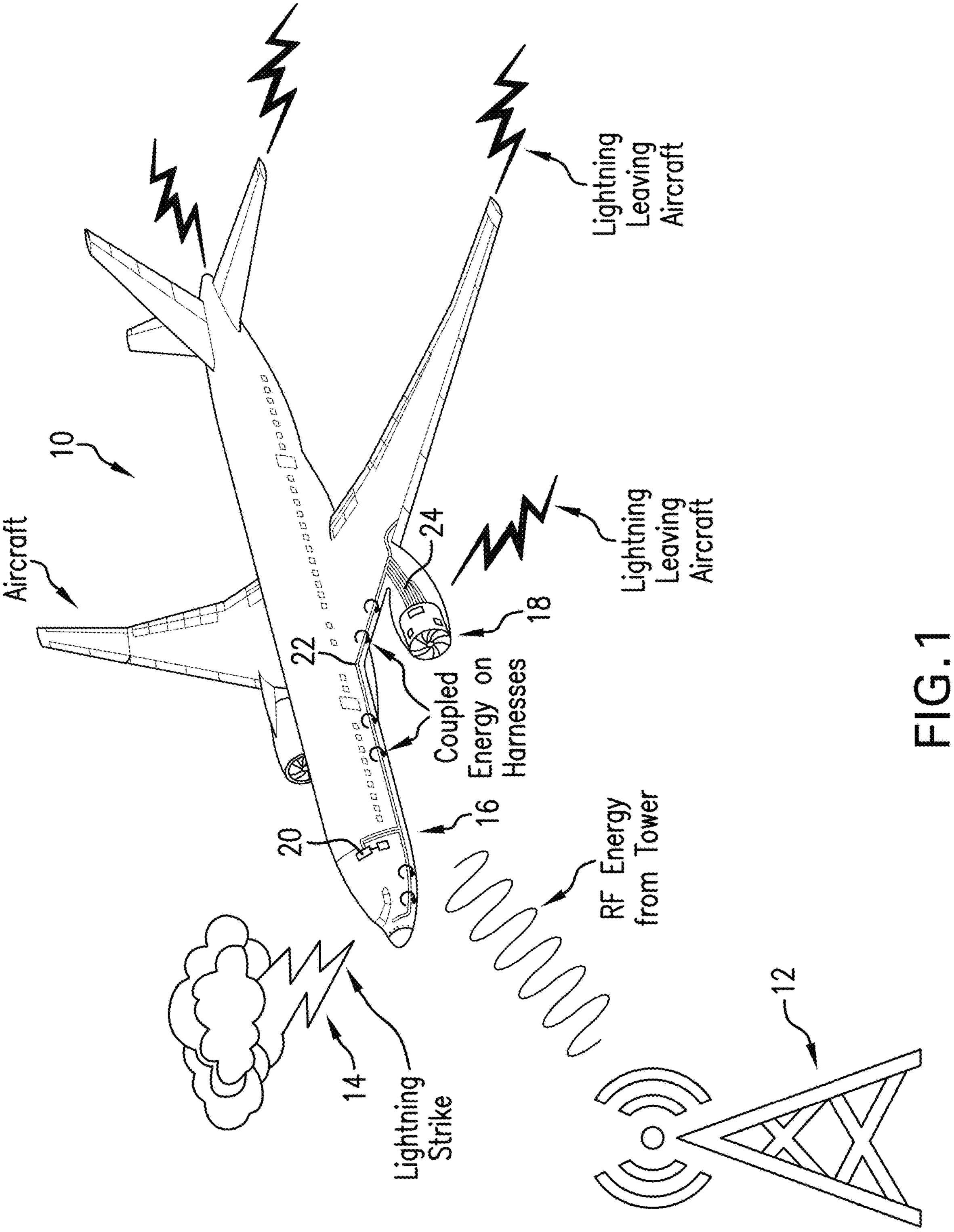
FIG. 1 is a schematic diagram of a lightning event or radiated fields causing electromagnetic interference (EMI) of an engine control system of an aircraft.

FIG. 1 is a schematic diagram of a lightning event or radiated fields causing electromagnetic interference (EMI) of an engine control system of an aircraft. In FIG. 1, Aircraft 10 is exposed to EMI from two external sources-radio tower 12 and lightning 14. Aircraft 10 has engine control system 16, which controls some function or operation of aircraft engine 18. Engine control system 16 includes control circuitry 20, shielded cable assembly 22, electrical components 24 (such as, for example sensors, actuators, etc.). Control circuitry 20 electrically communicates with electrical components 24 via shielded cable assembly 22. Engine control system 16 has one or more loop resistances defined as the electrical resistance as measured between adjacent locations where the shielding of engine control system 16 are "grounded" (i.e., conductively coupled with the conductive frame of aircraft 10). The term grounded is typically used in reference to a conductive structure or frame of aircraft 10. Testing of EMI susceptibility and emission suppression of engine control system 16 ensures that safe function and operation of aircraft engine 18 continues during such EMI exposures to aircraft 10.

Figure 2:
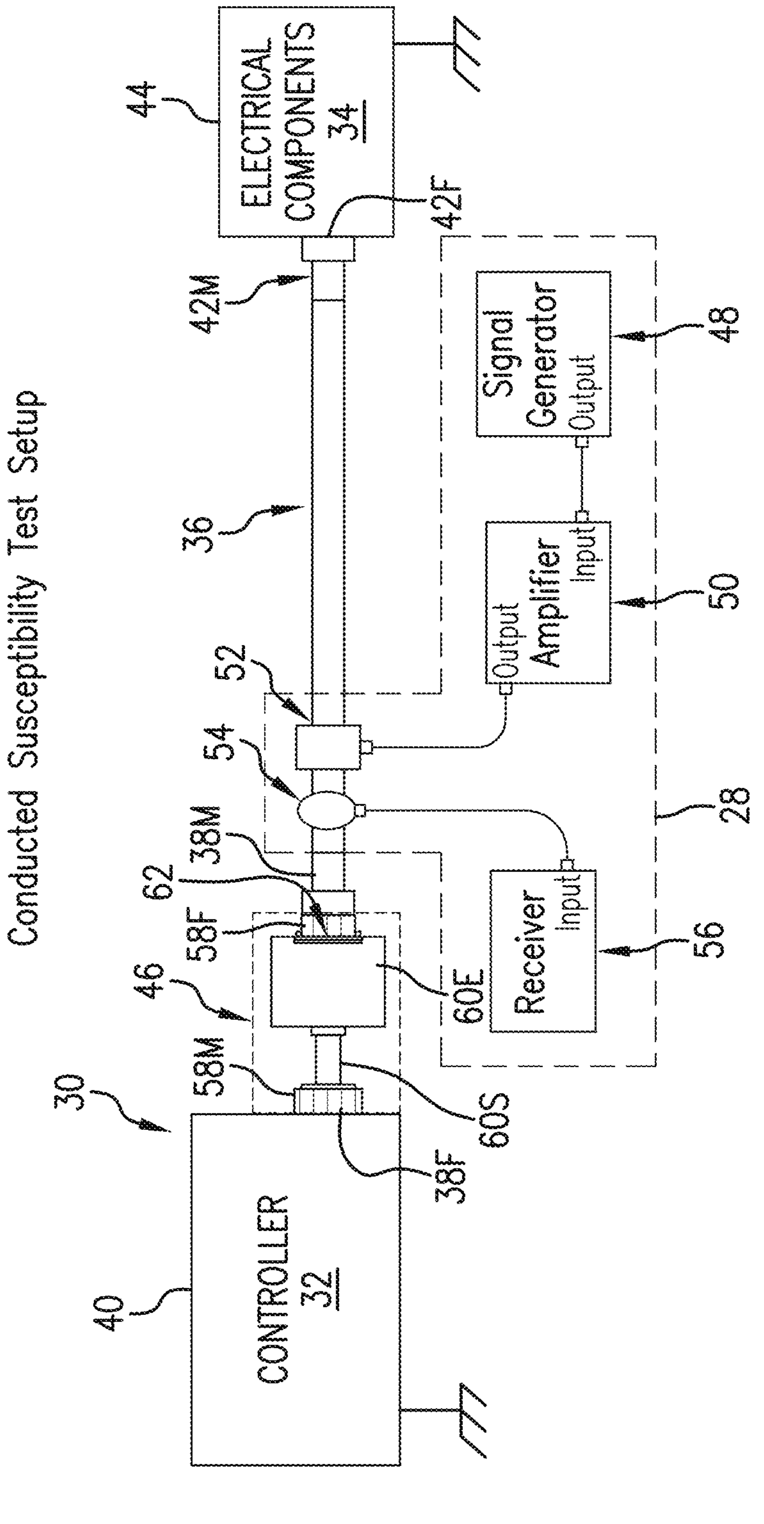
FIG. 2 is a schematic diagram of an example test setup for testing conducted EMI susceptibility of an electrical control system having a shielding cable assembly.

FIG. 2 is a schematic diagram of an example test setup for testing conducted EMI susceptibility of an electrical control system having a shielding cable assembly. In FIG. 2, EMI test apparatus 28 is configured to test EMI susceptibility of electrical control system 30. Electrical control system 30 includes controller 32 and remote electrical components 34. Electrical control system 30 can be any of the various controllable systems of an aircraft, such as, for example, control of flight systems, control of engine operations, control of landing gear systems, etc. Electrical components 34 can be any configuration of sensors and/or actuators that are used in such electrical control system 30. Controller 32 conductively communicates with electrical components 34 via shielded cable assembly 36. Shielded cable assembly 36 includes one or more insulated conductive wires that are shielded by a shield. The shield of shielded cable assembly 36 is a conductive sheath wrapped about the one or more insulated conductive wires of shielded cable assembly 36 or a conductive lumen through which run the one or more insulated conductive wires of shielded cable assembly 36. Typically, the shield runs from connector to connector of shielded cable assembly 36 and is conductively connected to a backshell or a backshell-connecting member of these connectors of shielded cable assembly 36.

Electrical control system 30 includes various shielded connectors, including, first and second shielded connectors 38M and 38F, which are normally connected to one another. The M and F designations of first and second shielded connectors 38M and 38F designate the complementary nature of these connectors. For example, an M connector mates with an F connector and vice versa. First shielded connector 38M is attached to shielded cable assembly 36, and second shielded connector 38F is attached to grounded conductive enclosure 40 of controller 32. During normal operation of electrical control system 30, first shielded connector 38M of shielded cable assembly 36 is connected with second shielded connector 38F, which is attached to grounded conductive enclosure 40 of controller 32. During normal operation of electrical control system 30, third shielded connector 42M of shielded cable assembly 36 is connected with fourth shielded connector 42F, which is attached to grounded conductive enclosure 44 of electrical components 34. Thus, during normal operation of electrical control system 30, controller 32 is conductively coupled with electrical components 34 via shielded cable assembly 36.

During degraded-system (e.g., systems with increased bond resistance) EMI-susceptibility and emission-suppression testing, however, first and second shielded connectors 38M and 38F are disconnected from one another. During such degraded-system testing, interposed between first and second shielded connectors 38M and 38F is bond-degradation testing device 46. In the depicted embodiment, EMI test apparatus 28 includes signal generator 48, amplifier 50, injection probe 52, monitor probe 54, receiver 56. When testing electrical control system 30 by EMI test apparatus 28, first shielded connector 38M of shielded cable assembly 36 is disconnected from second shielded connector 38F of controller 32. Bond-degradation testing device 46 is then connected between first shielded connector 38M of shielded cable assembly 36 and second shielded connector 38F of controller 32. Bond-degradation test device 46 is essentially an interconnection device that provides electrical connection between corresponding contacts of first shielded connector 38M and second shielded connector 38F. Bond-degradation test device 46 also provides a controlled resistive connection between the backshell of first shielded connector 38M and the backshell-connecting member of second shielded connector 38F, thereby compromising (i.e., increasing) the loop resistance between controller 32 and electrical components 34.

Bond-degradation testing device 46 includes first and second complementary mating connectors 58M and 58F. Complementary mating connectors 58M and 58F are complementary to and configured to connect with second and first shielded connectors 38F and 38M, respectively, of electrical control system 30. First complementary mating connector 58M has a plurality of contacts surrounded by a conductive backshell configured to connect to a plurality of contacts and a conductive backshell-connecting member of second shielded connector 38F of the electrical control system 30. Second complementary mating connector 58F has a plurality of contacts surrounded by a conductive backshell-connecting member configured to connect to a plurality of contacts and a conductive backshell of first shielded connector 38M of the electrical control system 30. Bond-degradation testing device 46 has a plurality of conductive wires extending between and connecting corresponding ones of the pluralities of contacts of first and second complementary mating connectors 58M and 58F. Thus, when bond-degradation testing device 46 is interposed between controller 32 and shielded cable assembly 36, conductive connection is maintained between corresponding contacts of first and second shielded connectors 38M and 38F.

Bond-degradation testing device 46 also provides conductive connection, albeit resistive, between the shielding of controller 32 and the shielding of shielded cable assembly 36. Bond-degradation testing device 46 is itself shielded, albeit with shielding compromised in a control fashion by bond-degradation testing device, as will be shown below. The shielding of bond-degradation testing device 46 encloses and/or surrounds the plurality of wires extending between and connecting first and second complementary mating connectors 58M and 58F. The shielding of bond-degradation testing device 46 conductively couples, albeit with a controlled resistance, the backshell of first complementary mating connector 58M and the backshell-connecting member of second complementary mating connector 58F. In the depicted embodiment, the shielding of bond-degradation testing device 46 includes grounded shielded enclosure 60E, conductive sheath 60S as well as the backshell of complementary mating connector 58M and the backshell-connecting member of complementary mating connector 58F. The compromising of shielding by bond-degradation testing device 46 models or mimics a degraded bond between the shield connection of first and second complementary mating connectors 58M and 58F, between which bond-degradation testing device is located. Bond-degradation testing device 46 models or mimics such a degraded bond using resistive annulus 62. A resistance can be introduced anywhere between the backshell of first complementary mating connector 58M and the backshell-connecting member of second complementary mating connector 58F. In the depicted embodiment, for example, resistive annulus 62 is a resistive gasket that is interposed between mating surfaces of second complementary mating connector 58F and grounded shielded enclosure 60E.

Figure 5:
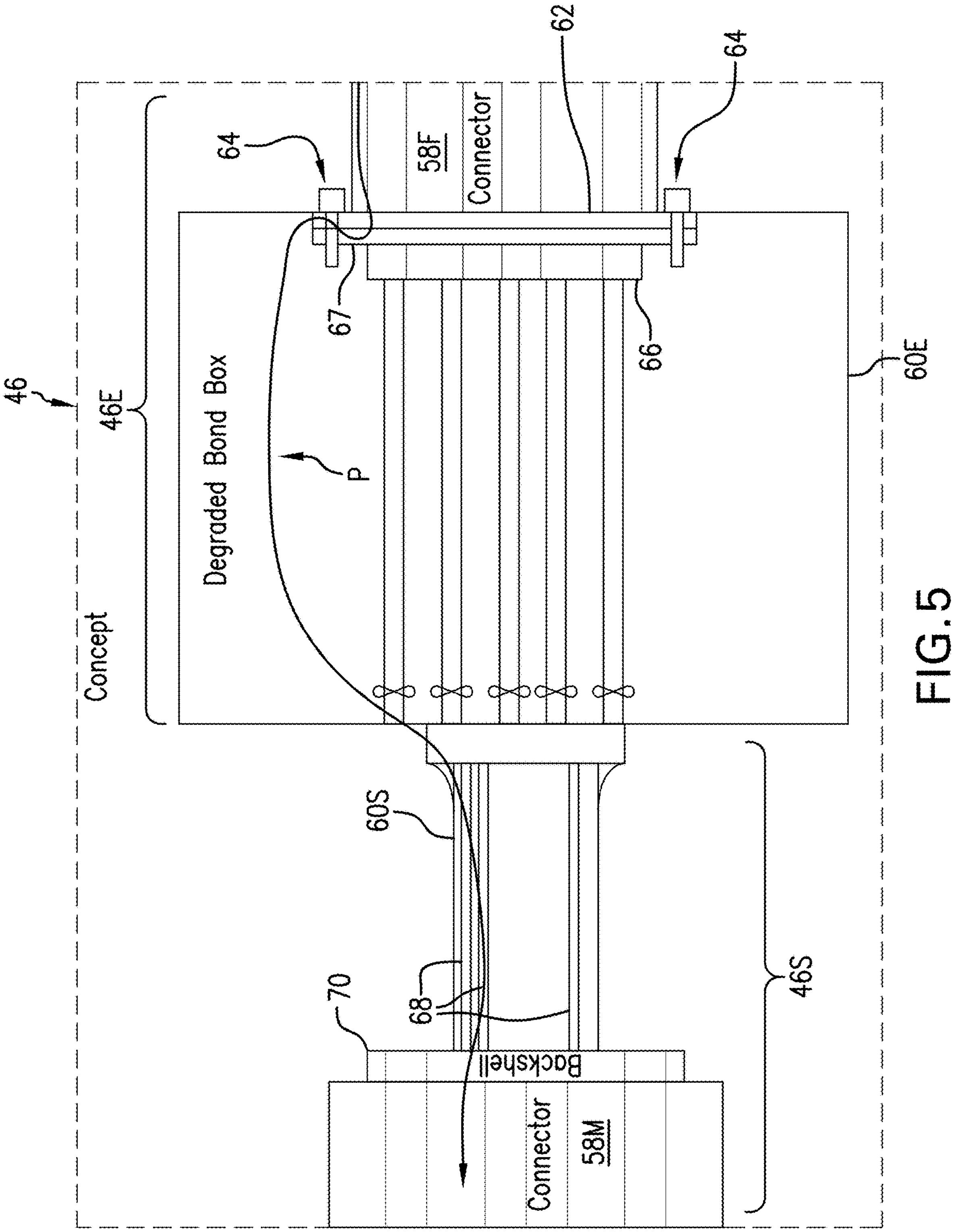
FIG. 5 is a schematic diagram of an example of a bond-degradation testing device.

Insulative hardware (e.g., nylon screws, bolts, washers, etc.) can be used to attach complementary mating connector 58F to grounded shielded enclosure 60E to mitigate any parallel conductive paths introduced by use of conductive hardware. Typically, the mating surface 67 (e.g., a flange as is shown in FIG. 5) extends from and is conductively coupled to backshell-connecting member 66 of second complementary mating connector 58F. Resistive annulus 62 thereby introduces a resistance between the backshell-connecting member of complementary mating connector 58F and grounded shielded enclosure 60E. Resistive annulus 62 can be made of a material that has a homogeneous resistivity throughout. Using such a material can result in conductive, albeit resistive, coupling of the backshell-connecting member of complementary mating connector 58F and grounded shielded enclosure 60E throughout resistive annulus 62 circumscribing the conductive wires and/or contacts traversing within resistive annuls 62. In this way, shielding remains throughout electrical control system 30, although such shielding is resistive in part. In some embodiments, a plurality of resistive annuli introducing a plurality of different resistances can be used. Operability of electrical control system 30 can then be determined as a function of bond resistance. Acceptable bond resistances can be and are often specified. For example, a bond resistance of less than 2.5 mΩ can be specified as acceptable values of bond resistance. Various values of resistance of resistive annulus 62 can be used to represent degraded bond resistances. For example, the resistance introduced by resistive annulus 62 can be between 50 mΩ and 500 mΩ.

After introducing, via bond-degradation testing device 46, a known resistance into the loop resistance between grounded conductive enclosures 40 and 44 or controller 32 and electrical components 34, respectively, testing of operability of electrical control system 30 can be performed. Testing is performed by inducing a radio-frequency signal in the shielding of electrical control system 30, as compromised by bond-degradation testing device 46, and then determining operability, system performance, and level of electrical emissions of electrical control system 30 as compromised. In some embodiments, a radio-frequency signal can be generated by signal generator 48, thereby simulating EMI signal produced by a radio tower. In other embodiments, a transient signal that mimics a lightning strike can be generated by signal generator 48. The radio-frequency and/or transient signals generated by signal generator 48 are then amplified by amplifier 50. The radio-frequency and/or transient signal amplified by amplifier 50 is then injected into the shielding of electrical control system 30 via conduction or radiation. In the FIG. 2 embodiment, the radio-frequency and/or transient signal is injected by conduction via conductive injection probe 52. The radio-frequency and/or transient signal injected via injection probe 52 can be sensed via monitor probe 54. Receiver 56 can receive the sensed radio-frequency signal and measure a magnitude of the radio-frequency and/or transient signal sensed. Testing can involve varying amplitude and/or frequency of the radio-frequency and/or transient signal injected into the shielding of electrical control system 30 as well as varying the resistance introduced by bond-degradation testing system 46. Operability of electrical control system can be determined in this three-dimensional space (i.e., amplitude, frequency, and resistance). In addition to these three dimensions of testing, location of bond-degradation testing device 46 can be changed. For example, bond-degradation testing device can be interposed between various other connectors of electrical control system 30.

Figure 3:
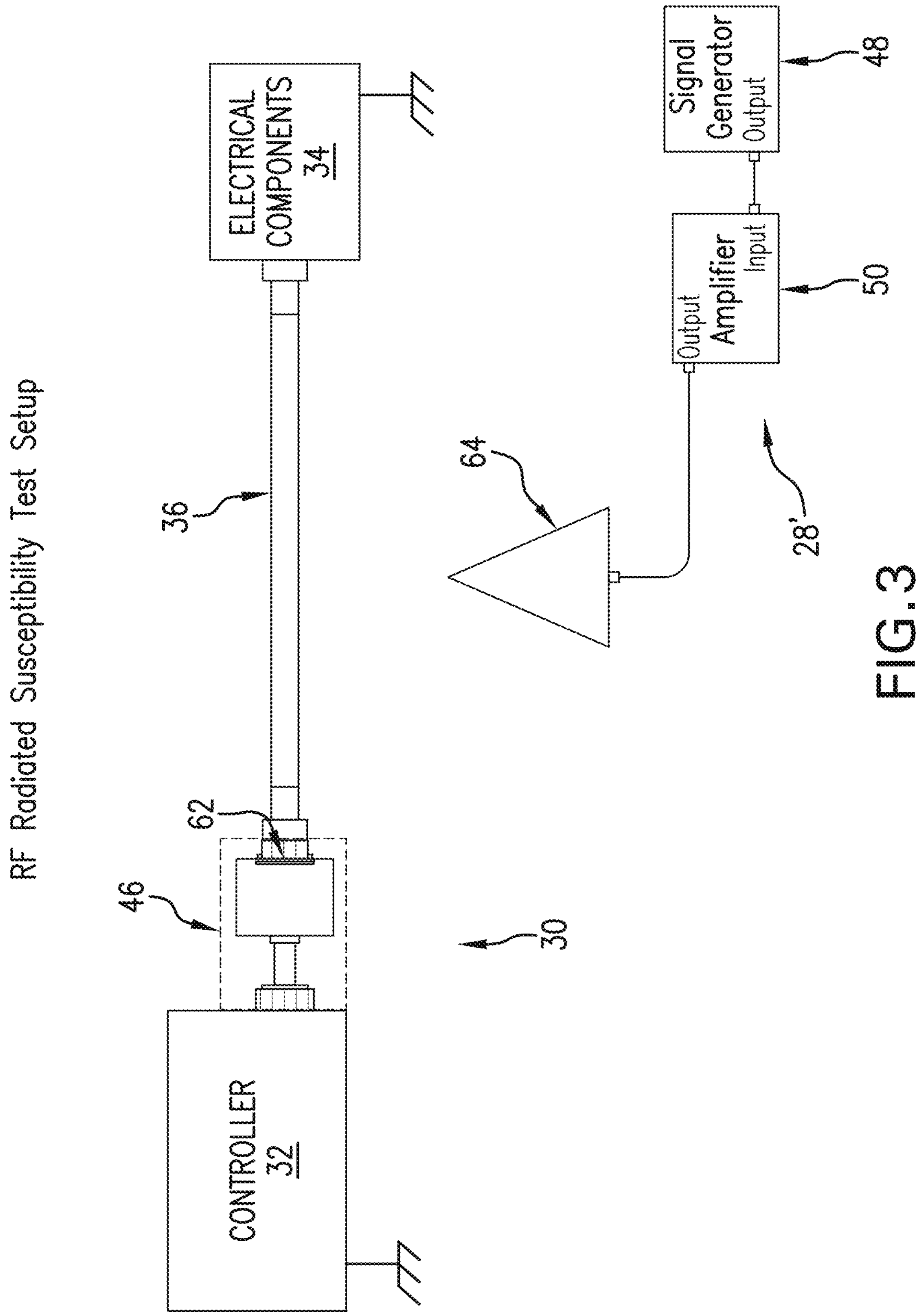
FIG. 3 is a schematic diagram of an example test setup for testing radiated EMI susceptibility of an electrical control system having a shielding cable assembly.

FIG. 3 is a schematic diagram of an example test setup for testing radiated EMI susceptibility of an electrical control system having a shielding cable assembly. In FIG. 3, EMI test apparatus 28' is configured to test EMI susceptibility of electrical control system 30. Instead of inducing the radio-frequency and/or transient signal via conduction, as EMI test apparatus 28 depicted in FIG. 2 did, EMI test apparatus 28' of FIG. 3 radiatively induces the radio-frequency and/or transient signal. Thus, instead of using conductive injection probe 52, as depicted in FIG. 2, antenna 64 radiates the radio frequency, as amplified by amplifier 50. The radiated radio-frequency and/or transient signal can then couple to the shielding of electrical control system 30. The coupled radio-frequency and/or transient signal can again be sensed and measured as was shown in the FIG. 2 embodiment. Testing of operability and system performance of electrical control system 30 can then be performed as was described above with reference to FIG. 2.

Figure 4:
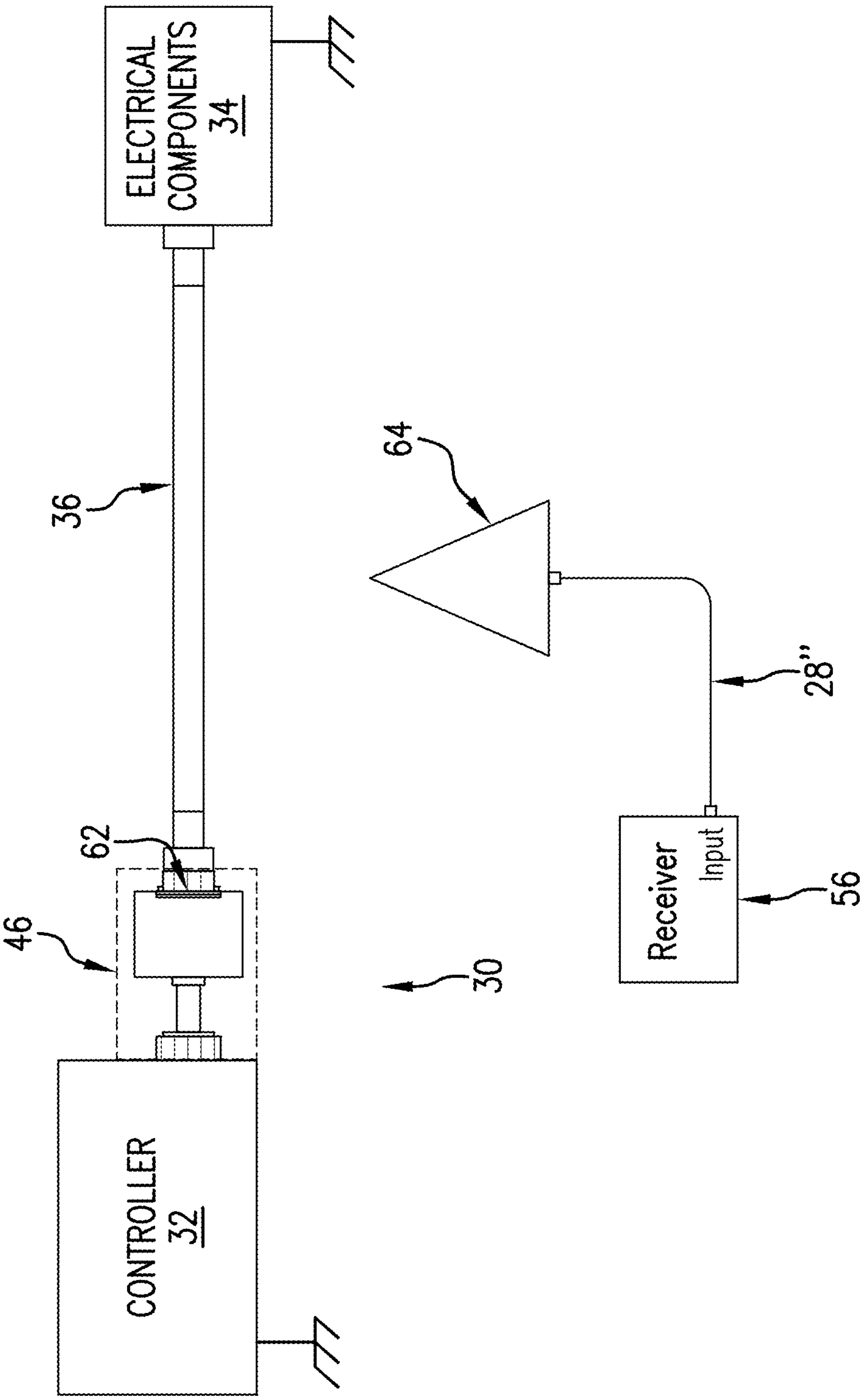
FIG. 4 is a schematic diagram of an example test setup for testing suppression of emissions of an electrical control system having a shielding cable assembly.

FIG. 4 is a schematic diagram of an example test setup for testing suppression of emissions from an electrical control system having a shielding cable assembly. In FIG. 4, emission suppression test apparatus 28" is configured to test electromagnetic emission levels of electrical control system 30. Any electromagnetic emissions from electrical control system 30 can be received by antenna 64. Receiver 56 can then measure various metrics of the electromagnetic emission received by antenna 64. Receiver 56 can then provide such metrics to a user or to a computer for further analysis.

FIG. 5 is a schematic diagram of an example of a bond-degradation testing device. In FIG. 5, bond-degradation testing device 46 includes shielded enclosure portion 46E, and shielded cable portion 46S. Second complementary mating connector 58F is attached to shielded enclosure portion 46E with resistive annulus 62 sandwiched between mating surface 67 of second complementary mating connector 58F and the mating surface of conductive enclosure 60E of shielded enclosure portion 46E. Insulative hardware 64 is used for attaching second complementary mating connector 58F and conductive enclosure 60E of shielded enclosure portion 46E. By connecting second complementary mating connector 58F with conductive enclosure 60E of shielded enclosure portion 46E in this manner, resistive annulus 62 introduces a controlled resistance RANNULUS between mating surface 67 of second complementary mating connector 58F and conductive enclosure 60E of shielded enclosure portion 46E.

First complementary mating connector 58M is attached to shielded cable portion 46S at a first end. Shielded cable portion 46S is connected to shielded enclosure portion 46E at a second end. Conductive sheath 60S surrounds and provides shielding of flexible insulated conductive wires 68, which run therethrough. Conductive sheath 60S of shielded cable portion 46S is conductively coupled both to backshell 70 of first complementary mating connector 58M and to conductive enclosure 60E of shielded enclosure portion 46E. Insulated conductive wires 68 extend between corresponding contacts of first and second complementary mating connectors 58M and 58F, thereby facilitating proper communication between controller 32 and electrical components 34, when bond-degradation testing device 46 is connected therebetween. Path P of electrical conductivity between backshell 70 and backshell-connecting member 66 of first and second complementary mating connectors 58M and 58F, respectively, is shown in FIG. 4. Path P shows how resistive annulus 62 provides resistive conduction between backshell-connecting member 66 and backshell 70 of second and first complementary mating connectors 58F and 58M, respectively.

Figure 6A:
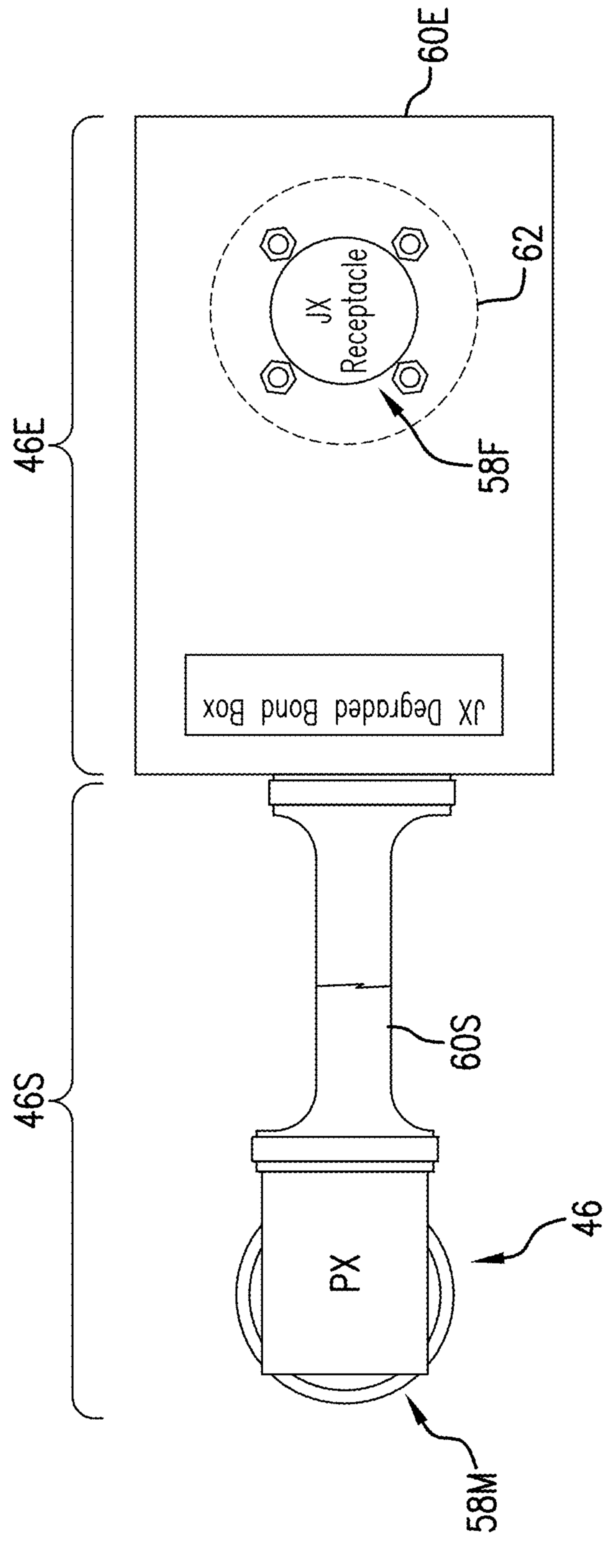
FIGS. 6A and 6B are plan and side-elevation views of an example of a degraded bonding box used for testing EMI/Lightning susceptibility and emissions suppression.
Figure 6B:
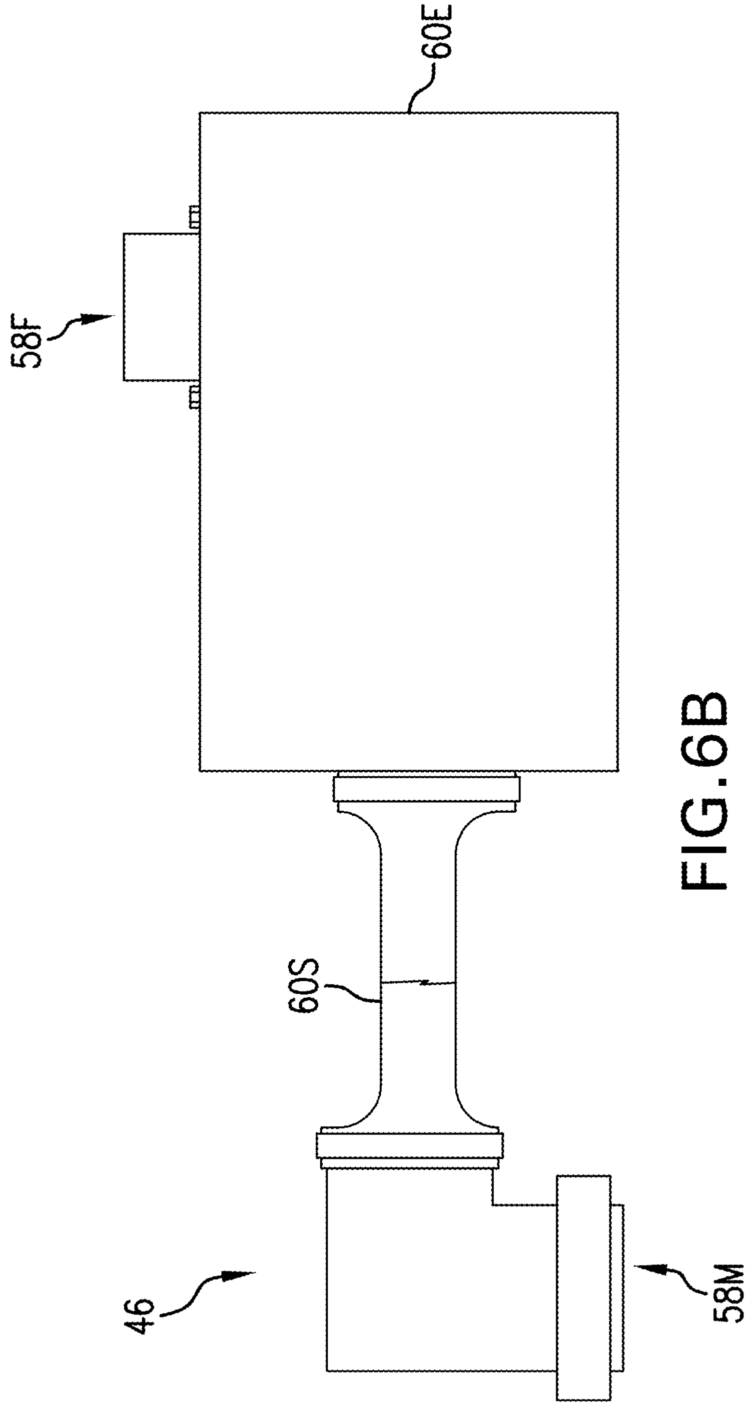

FIGS. 6A and 6B are plan and side-elevation views of an example of a degraded bonding box used for testing EMI susceptibility. In FIGS. 6A and 6B, bond-degradation testing device 46 includes shielded enclosure portion 46E and shielded cable portion 46S. In other embodiments, bond-degradation testing device 46 can have only shielded enclosure portion 46E or shielded cable portion 46S. Shielded enclosure portion 46E facilitates introduction of resistance $R_{ANNULUS}$ by resistive annulus 62 sandwiched between mating surfaces of second complementary mating connector 58F and conductive enclosure 60E of shielded enclosure portion 46E. Shielded cable portion 46S provides a flexible cable assembly so as to facilitate connection between first and second shielded connectors 38M and 38F of electrical control system 30.

Discussion of Possible Embodiments

The following are non-exclusive descriptions of possible embodiments of the present invention.

Apparatus and associated methods relate to a bond-degradation device for testing EMI susceptibility and/or emission suppression of an electrical control system that includes a shielded cable assembly. The bond-degradation device includes a resistive annulus configured to be interposed between normally-connected first and second shielded connectors of the electrical control system. The resistive annulus introduces a resistance between shields of the normally-connected first and second shielded connectors thereby compromising integrity of the shielding of conductive wires within the shielding of the shielded cable assembly by increasing loop resistance of the shielding. The bond-degradation testing device includes a first complementary mating connector having a plurality of contacts surrounded by a conductive backshell configured to connect to a plurality of contacts and a conductive backshell-connecting member of the second shielded connector of the electrical control system. The bond-degradation testing device includes a second complementary mating connector having a plurality of contacts surrounded by a conductive backshell-connecting member configured to connect to a plurality of contacts and a conductive backshell of the first shielded connector of the electrical control system. The bond-degradation testing device includes a plurality of conductive wires that extend between and connect corresponding ones of the pluralities of contacts of the first and second complementary mating connectors. The bond-degradation testing device also includes a conductive shield that surrounds the plurality of wires and conductively couple to backshell of the first complementary mating connector and the backshell-connecting member of the second complementary mating connector.

The system of the preceding paragraph can optionally include, additionally and/or alternatively, any one or more of the following features, configurations and/or additional components:

A further embodiment of the foregoing bond-degradation testing device, wherein the first and second complementary mating connectors can be complementary to the first and second shielded connectors, respectively.

A further embodiment of any of the foregoing bond-degradation testing devices, wherein the resistive annulus can surround the plurality of conductive wires that extend between and connect the corresponding ones of the pluralities of contacts of the first and second complementary mating connectors.

A further embodiment of any of the foregoing bond-degradation testing devices, wherein the resistive annulus can have a resistivity that is substantially, thereby introducing the resistance between the shields of the normally-connected first and second shielded connectors substantially uniform about the resistive annulus.

A further embodiment of any of the foregoing bond-degradation testing devices, wherein the resistive annulus can be configured to be replaceably interposed between the normally-connected first and second shielded connectors of the electrical control system, thereby facilitating testing the EMI susceptibility and emission suppression of the electrical control system with different values of loop resistance.

A further embodiment of any of the foregoing bond-degradation testing devices, wherein the resistive annulus can introduce a resistance between the shields of the normally-connected first and second shielded connectors that is at least ten times a specified resistance of a normal bond resistance between the shields of the normally-connected first and second shielded connectors when connected to one another.

The bond-degradation testing device of claim 1, wherein the resistive annulus introduces a resistance between the shields of the normally-connected first and second shielded connectors that is between 50 mΩ and 500 mΩ.

A further embodiment of any of the foregoing bond-degradation testing devices, wherein a ratio of the resistance introduced by the resistive annulus and a resistance as measured between the backshell of the first complementary mating connector and the backshell-connecting of the second complementary mating connector of the bond-degradation testing device, can be greater than 90%.

A further embodiment of any of the foregoing bond-degradation testing devices, wherein the plurality of conductive wires can be a plurality of flexible conductive wires.

A further embodiment of any of the foregoing bond-degradation testing devices, wherein at least a portion of the conductive shield can be flexible, thereby facilitating the bond-degradation testing device to be interposed between the normally-connected first and second shielded connectors.

A further embodiment of any of the foregoing bond-degradation testing devices can further include a metal housing, to which one of the first and second complementary mating connectors is mounted via non-conductive mounting hardware. The conductive annulus is located between the metal housing and the one of the first and second complementary mating connectors mounted to the metal housing, thereby introducing the resistance therebetween.

A further embodiment of any of the foregoing bond-degradation testing devices can further include a shielded enclosure, to which one of the first and second complementary mating connectors attaches.

A further embodiment of any of the foregoing bond-degradation testing devices can further include insulative hardware that attaches the one of the first and second complementary mating connectors to the shielded enclosure.

A further embodiment of any of the foregoing bond-degradation testing devices, wherein the insulative hardware can include nylon.

A further embodiment of any of the foregoing bond-degradation testing devices, wherein the resistive annulus can be sandwiched between the one of the first and second complementary mating connectors and the shielded enclosure, thereby introducing the resistance therebetween.

Some embodiments relate to a method for testing EMI susceptibility of an electrical control system that includes a shielded cable assembly. The method includes disconnecting normally-connected first and second shielded connectors of the electrical control system. The method includes connecting a first complementary mating connector of a bond-degradation testing device to the second shielded connector of the electrical control system, thereby connecting a plurality of contacts surrounded by a conductive backshell of the first complementary mating connector of the bond-degradation testing device with a plurality of contacts and a conductive backshell-connecting member, respectively, of the second shielded connector of the electrical control system. The method includes connecting a second complementary mating connector of a bond-degradation testing device to the first shielded connector of the electrical control system, thereby connecting a plurality of contacts surrounded by a conductive backshell-connecting member of the second complementary mating connector of the bond-degradation testing device with a plurality of contacts and a conductive backshell, respectively, of the first shielded connector of the electrical control system. The bond-degradation testing device includes a plurality of conductive wires that extend between and connect corresponding ones of the pluralities of contacts of the first and second complementary mating connectors. The bond-degradation testing device includes a conductive shield that surrounds the plurality of wires and conductively couple to backshell of the first complementary mating connector and the backshell-connecting member of the second complementary mating connector. The bond-degradation testing device also includes a resistive annulus interposed between the backshell of the first complementary mating connector and the backshell-connecting member of the second complementary mating connectors, thereby compromising integrity of the shielding of conductive wires within the shielding of the shielded cable assembly by increasing loop resistance of the shielding. The method also includes testing EMI susceptibility or emission suppression of the electrical control system.

The method of the preceding paragraph can optionally include, additionally and/or alternatively, any one or more of the following features, configurations and/or additional components:

A further embodiment of the foregoing method, wherein testing EMI susceptibility or emission suppression of the electrical control system can include operating the electrical control system. The method can further include sensing emissions from the electrical control system.

A further embodiment of any of the foregoing methods can further include comparing the emissions sensed with an emission specification. The method can further include reporting the emissions sensed in response to the emissions sensed exceeding the emission specification.

A further embodiment of any of the foregoing methods, wherein testing EMI susceptibility or emission suppression of the electrical control system can include conductively or radiatively coupling an EMI signal onto the shielding of the shielded cable assembly. The method can further include testing operability of the electrical control system.

A further embodiment of any of the foregoing methods, wherein conductively or radiatively coupling an EMI signal onto the shielding of the shielded cable assembly can include conductively or radiatively coupling a transient signal that models a lightning strike onto the shielding of the shielded cable assembly.

It will be recognized that the invention is not limited to the implementations so described, but can be practiced with modification and alteration without departing from the scope of the appended claims. For example, the above implementations may include specific combination of features. However, the above implementations are not limited in this regard and, in various implementations, the above implementations may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

The invention claimed is:

1. A bond-degradation testing device for testing EMI Electromagnetic Interference (EMI) susceptibility and/or emission suppression of an electrical control system that includes a shielded cable assembly having a first plurality of conductive wires within a shielding, the bond-degradation testing device comprising:

- a resistive annulus configured to be interposed between normally-connected first and second shielded connectors of the electrical control system, the resistive annulus introducing a resistance between shields of the normally-connected first and second shielded connectors of the electrical control system thereby compromising integrity of the shielding of the shielded cable assembly by increasing loop resistance;
- a first complementary mating connector having a plurality of contacts surrounded by a conductive backshell configured to connect to a plurality of contacts and a conductive backshell-connecting member of the second shielded connector of the electrical control system;
- a second complementary mating connector having a plurality of contacts surrounded by a conductive backshell-connecting member configured to connect to a plurality of contacts and a conductive backshell of the first shielded connector of the electrical control system;
- a second plurality of conductive wires that extend between and connect corresponding ones of the pluralities of contacts of the first and second complementary mating connectors; and
- a conductive testing-device shield that surrounds the second plurality of conductive wires and conductively couple to the conductive backshell of the first complementary mating connector and the conductive backshell-connecting member of the second complementary mating connector.

2. The bond-degradation testing device of claim 1, wherein the first and second complementary mating connectors are complementary to the first and second shielded connectors, respectively.

3. The bond-degradation testing device of claim 1, wherein the resistive annulus surrounds the plurality of conductive wires that extend between and connect the corresponding ones of the pluralities of contacts of the first and second complementary mating connectors.

4. The bond-degradation testing device of claim 1, wherein the resistive annulus has a resistivity that is substantially, thereby introducing the resistance between the shields of the normally-connected first and second shielded connectors substantially uniform about the resistive annulus.

5. The bond-degradation testing device of claim 1, wherein the resistive annulus is configured to be replaceably interposed between the normally-connected first and second shielded connectors of the electrical control system, thereby facilitating testing the EMI susceptibility and emission suppression of the electrical control system with different values of loop resistance.

6. The bond-degradation testing device of claim 1, wherein the resistive annulus introduces the resistance between the shields of the normally-connected first and second shielded connectors that is at least ten times a specified resistance of a normal bond resistance between the shields of the normally-connected first and second shielded connectors when connected to one another.

7. The bond-degradation testing device of claim 1, wherein the resistive annulus introduces the resistance between the shields of the normally-connected first and second shielded connectors that is between 50 mΩ and 500 mΩ.

8. The bond-degradation testing device of claim 7, wherein a ratio of the resistance introduced by the resistive annulus and a resistance as measured between the conductive backshell of the first complementary mating connector and the conductive backshell-connecting member of the second complementary mating connector of the bond-degradation testing device, is greater than 90%.

9. The bond-degradation testing device of claim 1, wherein the plurality of conductive wires is a plurality of flexible conductive wires.

10. The bond-degradation testing device of claim 9, wherein at least a portion of the conductive testing-device shield is flexible, thereby facilitating the bond-degradation testing device to be interposed between the normally-connected first and second shielded connectors.

11. The bond-degradation testing device of claim 1, further comprising:

- a metal housing, to which one of the first and second complementary mating connectors is mounted via non-conductive mounting hardware,
- wherein the conductive resistive annulus is located between the metal housing and the one of the first and second complementary mating connectors mounted to the metal housing, thereby introducing the resistance therebetween.

12. The bond-degradation testing device of claim 1, wherein the conductive testing-device shield comprises:

a shielded enclosure, to which one of the first and second complementary mating connectors attaches are attached.

13. The bond-degradation testing device of claim 12, further comprising:

insulative hardware that attaches the one of the first and second complementary mating connectors to the shielded enclosure.

14. The bond-degradation testing device of claim 13, wherein the resistive annulus is sandwiched between the one of the first and second complementary mating connectors and the shielded enclosure, thereby introducing the resistance therebetween.

15. A method for testing EMI Electromagnetic Interference (EMI) susceptibility of an electrical control system that includes a shielded cable assembly having a first plurality of conductive wires within a shielding, the method comprising:

disconnecting normally-connected first and second shielded connectors of the electrical control system;

connecting a first complementary mating connector of a bond-degradation testing device to the second shielded connector of the electrical control system, thereby connecting a plurality of contacts surrounded by a conductive backshell of the first complementary mating connector of the bond-degradation testing device with a plurality of contacts and a conductive backshell-connecting member, respectively, of the second shielded connector of the electrical control system;

connecting a second complementary mating connector of the bond-degradation testing device to the first shielded connector of the electrical control system, thereby connecting a plurality of contacts surrounded by a conductive backshell-connecting member of the second complementary mating connector of the bond-degradation testing device with a plurality of contacts and a conductive backshell, respectively, of the first shielded connector of the electrical control system, wherein the bond-degradation testing device includes:

a second plurality of conductive wires that extend between and connect corresponding ones of the pluralities of contacts of the first and second complementary mating connectors;

a conductive testing device shield that surrounds the second plurality of conductive wires and conductively couples to the conductive backshell of the first complementary mating connector and the backshell-connecting member of the second complementary mating connector; and a resistive annulus interposed between the conductive backshell of the first complementary mating connector and the conductive backshell-connecting member of the second complementary mating connectors, thereby compromising integrity of the shielding of the shielded cable assembly by increasing loop resistance and testing EMI susceptibility or emission suppression of the electrical control system.

16. The method of claim 15, wherein the testing EMI susceptibility or emission suppression of the electrical control system comprises:

operating the electrical control system; and sensing emissions from the electrical control system.

17. The method of claim 16 further comprising:

comparing the emissions sensed with an emission specification; and reporting the emissions sensed in response to the emissions sensed exceeding the emission specification.

18. The method of claim 15, wherein the testing EMI susceptibility or emission suppression of the electrical control system comprises:

conductively or radiatively coupling an EMI signal onto the shielding of the shielded cable assembly; and testing operability of the electrical control system.

19. The method of claim 18, wherein the conductively or radiatively coupling an EMI signal onto the shielding of the shielded cable assembly comprises:

conductively or radiatively coupling a transient signal that models a lightning strike onto the shielding of the shielded cable assembly.

20. A bond-degradation testing device for testing Electromagnetic Interference (EMI) susceptibility and/or emission suppression of an electrical control system that includes a shielded cable assembly having a first plurality of conductive wires within a first conductive shield, the shielded cable assembly having a first shielded connector configured to connect to a second shielded connector of the electrical control system, the first shielded connector having a first plurality of contacts surrounded by a first conductive backshell, the second shielded connector having a first plurality of complementary contacts surrounded by a first conductive backshell-connecting member, the bond-degradation testing device comprising:

a resistive annulus configured to be interposed between the first conductive backshell of the first shielded connector of the shielded cable assembly and the first conductive backshell-connecting member of the second shielded connector of the electrical control system, thereby introducing a resistance therebetween;

a first complementary mating connector having a second plurality of contacts surrounded by a second conductive backshell, the second plurality of contacts configured to connect to the first plurality of complementary contacts of the second shielded connector of the electrical control system and the first conductive backshell configured to connect to the conductive backshell-connecting member of the second shielded connector of the electrical control system;

a second complementary mating connector having a second plurality of complementary contacts surrounded by a second conductive backshell-connecting member, the second plurality of complementary contacts configured to connect to the first plurality of contacts of the first shielded connector of the shielded cable assembly and the second conductive backshell-connecting member configured to connect to the first conductive backshell of the first shielded connector of the electrical control system;

a second plurality of conductive wires that extend between and connect the second plurality of contacts of the first complementary mating connector with corresponding ones of the second plurality of complementary contacts of the second complementary mating connector; and a second conductive shield that surrounds the second plurality of conductive wires and conductively couple to the second conductive backshell of the first complementary mating connector and the second conductive backshell-connecting member of the second complementary mating connector.

* * * * *